United States Patent [19]

Ishimaru

[11] Patent Number: 5,731,623
[45] Date of Patent: Mar. 24, 1998

[54] BIPOLAR DEVICE WITH TRENCH STRUCTURE

[75] Inventor: Kazunari Ishimaru, Yokohama, Japan

[73] Assignee: Kabushiki Kaisha Toshiba, Tokyo, Japan

[21] Appl. No.: 845,646

[22] Filed: Apr. 25, 1997

Related U.S. Application Data

[63] Continuation of Ser. No. 318,978, Oct. 6, 1994, abandoned.

[30] Foreign Application Priority Data

Oct. 7, 1993 [JP] Japan .................. 5-251843

[51] Int. Cl.$^6$ ........................... H01L 29/732
[52] U.S. Cl. ............... 257/517; 257/506; 257/509
[58] Field of Search ........................ 257/526, 524, 257/525, 509, 574, 506, 517

[56] References Cited

U.S. PATENT DOCUMENTS

| | | | |
|---|---|---|---|
| 4,073,054 | 2/1978 | Kaji et al. | 257/517 |
| 4,929,996 | 5/1990 | Hutter | 257/514 |
| 4,949,145 | 8/1990 | Yano et al. | 257/517 |
| 4,963,957 | 10/1990 | Ohi et al. | 257/517 |
| 5,241,211 | 8/1993 | Tashiro | 257/526 |
| 5,644,157 | 7/1997 | Iida et al. | 257/521 |

FOREIGN PATENT DOCUMENTS

| | | | |
|---|---|---|---|
| 55-077172 | 6/1980 | Japan | 257/517 |
| 61-220465 | 9/1986 | Japan | 257/517 |

Primary Examiner—Minh-Loan Tran
Assistant Examiner—David B. Hardy
Attorney, Agent, or Firm—Loeb & Loeb LLP

[57] ABSTRACT

A buried collector layer is formed on a semiconductor substrate. An epitaxial layer is formed on the burled collector layer. A plurality of element separating trenches of roughly the same depth and filled with an insulating material are formed in the epitaxial layer. When these trenches are formed deep enough to penetrate the buried collector layer to the semiconductor substrate, an impurity region of conductivity the same as that of the buried collector layer is formed at a predetermined position of the semiconductor substrate and adjoining to at least one bottom portion of a plurality of the trenches. Further, when a separation layer is formed on the semiconductor substrate and adjoining to the buried collector layer to separate the semiconductor device from another adjacent semiconductor device, at least one of a plurality of trenches is formed on a boundary surface between the buried collector layer and the separation layer.

9 Claims, 5 Drawing Sheets

BIPOLAR DEVICE WITH TRENCH STRUCTURE

This is a continuation of application Ser. No. 08/318,978, filed on Oct. 6, 1994, now abandoned

BACKGROUND OF THE INVENTION

1. Field of the Invention

The present invention relates to a semiconductor device with trench-dependent element separation structure and a method of manufacturing the same device.

2. Description of the Prior Art

Recently, in order to increase the integration rate of bipolar transistors and to decrease the parasitic capacity of bipolar transistors to obtain higher performance, trench-dependent element separation structures are widely adopted to separate the bipolar transistor elements effectively. FIGS. 1 and 2 are cross-sectional views showing prior art bipolar transistors with a trench-dependent element separation structure. In the bipolar transistor shown in FIG. 1, an epitaxial layer 4 and a buried collector layer 2 are formed on a semiconductor substrate 1. Further, two deep trenches 11a and 11b of the same depth are formed penetrating these layers 4 and 2, respectively. These trenches 11a and 11b are all filled with insulating material to completely separate the bipolar transistors from each other. In this case, the space required for separating the elements can be narrowed as compared with the conventional PN junction. Further, in the transistor region, another trench 11c shallower than the trenches 11a and 11b is formed penetrating only the epitaxial layer 4 (without penetrating the buried collector layer 2), and the trench 11c is also filled with insulating material to suppress the operation in the lateral direction and further to reduce a parasitic capacitance formed between a base region 22 and a buried collector lead electrode layer 20. Therefore, since the parasitic capacitance can be reduced markedly by use of trench-dependent element separation, it is possible to improve the transistor performance. Further, in FIG. 1, an emitter region 24 is formed in the base region 22. A base lead electrode 26 is formed at the base region 22, and an emitter lead electrode 30 is formed at the emitter region 24. Further, the reference numeral 28 denotes an insulating layer; 42 denotes an interlayer insulating film; and 44 denotes aluminum electrodes as do 44a, 44b and 44c, respectively.

On the other hand, it is preferable to adopt an LOCOS (localized oxidation of silicon) technique to separate broad bipolar transistor regions from each other. Therefore, FIG. 2 shows a bipolar transistor, in which the element separation region 13 is formed in accordance with the LOCOS technique. In this case, unlike the case shown in FIG. 1, it is unnecessary to form two sorts of trenches of different depths. In either case, the higher integration and higher performance of the conventional bipolar transistors have been realized so far by forming element-separating trenches having different depths, or having the same depth, but also with an element separation region.

In the prior art bipolar transistor of trench-dependent separation structure as shown in FIG. 1, the depth of the element separation region 11c formed at the bipolar transistor region must be shallower than that of the other element separation regions 11a and 11b. This is because when the depth of the element separation region 11c is the same as the depth of the other element separation regions 11a and 11b, the buried collector layer 2 is separated by the element separation region 11c, so that it is impossible to apply a potential to the buried collector layer 2 from the aluminum collector electrode 44c. In other words, it has been necessary to form two sorts of trenches of different depths.

Further, in the prior art bipolar transistors of the element separation structure as shown in FIG. 2, since the element separation region 13 is formed in accordance with the LOCOS technique, although trenches of the same depth can be used for element separation, at least two steps are required for forming the element separating trenches and the element separation regions, independently.

Accordingly, in the prior art method of manufacturing the semiconductor device with element separation structure as explained with reference to FIGS. 1 and 2, at least two different steps are required for element separation, so that there exists a problem in that the number of the element separation forming steps increases and thereby the manufacturing steps are complicated.

SUMMARY OF THE INVENTION

With these problems in mind, therefore, it is the object of the present invention to provide a semiconductor device and a method of manufacturing the same device, which can reduce the number of element separation forming steps without complicating the manufacturing steps.

To achieve the above-mentioned object, the present invention provides a semiconductor device, comprising: a buried collector layer formed on a semiconductor substrate; an epitaxial layer formed on the buried collector layer; and a plurality of element-separating trenches formed on the epitaxial layer and filled with an insulating material, all the element-separating trenches being substantially the same in depth.

A plurality of the trenches can be formed deep enough to penetrate the buried collector layer to the semiconductor substrate. In this case, the semiconductor further comprises an impurity region of conductivity the same as that of the buried collector layer, which is formed at a predetermined position of the semiconductor substrate and adjoining to at least one bottom portion of a plurality of the trenches formed deep enough to penetrate the buried collector layer.

Further, a separation layer can be formed on the semiconductor substrate and adjacent to the buried collector layer, to separate the semiconductor device from another adjacent semiconductor device. In this case, at least one of a plurality of trenches is formed on a boundary surface between the buried collector layer and the separation layer.

Further, the present invention provides a method of manufacturing a semiconductor device, comprising the steps of: forming a buried collector layer on a semiconductor substrate; forming an epitaxial layer on the buried collector layer; forming a plurality of trenches of substantially the same depth in the epitaxial layer; and filling a plurality of formed trenches with an insulating material to from element-separating trenches.

Further, in this method, it is preferable to include the steps of forming a plurality of the trenches deep enough to penetrate the buried collector layer; and forming an impurity region of conductivity the same as that of the buried collector layer, at a predetermined position of the semiconductor substrate and adjoining to at least one bottom portion of a plurality of the trenches formed deep enough to penetrate the buried collector region.

Further, in the semiconductor device according to the present invention, the depths of a plurality of the element-separating trenches are substantially the same with respect to each other. In this case, however, errors caused during the various manufacturing steps are of course disregarded and thereby omitted herein.

DETAILED DESCRIPTION OF THE EMBODIMENTS

Figure 3:
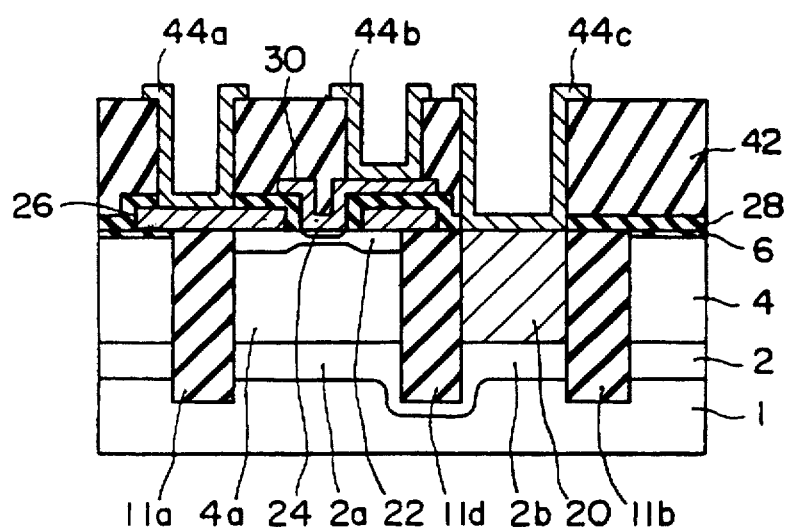
FIG. 3 is a cross-sectional view showing a first embodiment of the semiconductor device according to the present invention.

The first embodiment of the semiconductor device according to the present invention will be described hereinbelow with reference to FIG. 3. In FIG. 3, an N-type buried collector layer 2 and an N-type epitaxial layer 4 are laminated in sequence on a P-type silicon substrate 1. Further, three trenches 11a, 11b and 11d of the same depth are formed for element separation. In these three trenches, the trench 11d formed at a transistor region is formed without penetrating the buried collector layer 2, but the two trenches 11a and 11b are formed penetrating the buried collector layer 2. In other words, the buried collector layers 2a and 2b are connected to each other under a bottom portion of the trench 11d. Further, these trenches 11a, 11b and 11d are all filled with an insulating material. A base layer 22 is formed in an epitaxial layer 4a separated by the element separation region 11d, and an emitter layer 24 is formed in this base layer 22. Further, a base lead electrode 26 is formed connected to the base layer 22, and an emitter lead electrode 30 is formed connected to the emitter layer 24. The base lead electrode 26 and the emitter lead electrode 30 are formed separated by an insulating layer 28. Further, an aluminum electrode 44a is connected to the base lead electrode 26, and another aluminum electrode 44b is connected to the emitter lead electrode 30. In addition, the other epitaxial layer separated by the element separation region 11d is a buried collector lead electrode layer 20. Another aluminum electrode 44c is formed connected to the buried collector lead electrode layer 20. In FIG. 3, the reference numeral 6 denotes an oxide film.

The method of manufacturing the semiconductor device shown in FIG. 3 will be described hereinbelow with reference to FIGS. 4A to 4F.

Figure 4A:
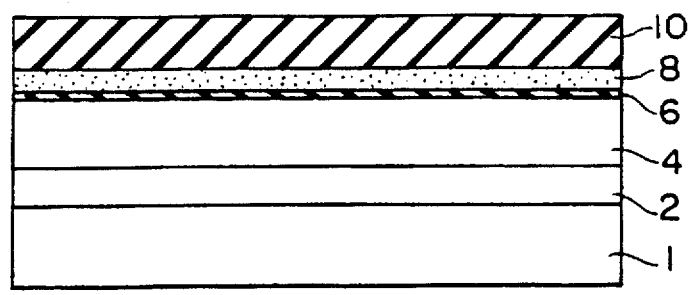
FIGS. 4A to 4F are cross-sectional views for assistance in explaining the manufacturing steps of the semiconductor device shown in FIG. 3.

As shown in FIG. 4A, an N-type buried collector layer 2 is formed on a P-type silicon substrate 1, and after that an N-type epitaxial layer 4 is grown. Successively, an oxide film 6 with a thickness of about 100 to 500 angstroms is formed on the grown epitaxial layer 4 in accordance with thermal oxidization. After that, a polysilicon layer 8 with a thickness of about 500 to 5000 angstroms is deposited on the oxide film 6 in accordance with an LPCVD (low-pressure chemical vapor deposition) method. This polysilicon layer 8 serves as a stopper layer when etched back as described later. The stopper layer 8 can also be a metallic film formed of SiN, tungsten siliside, titanium siliside, molybdenum, etc. Without being limited thereto, however, any material can be used as the stopper layer 8, as long as a selective etching ratio can be obtained when the material buried in the trenches is etched. Further, the stopper layer 8 can be formed by a CVD method or sputtering. Then, an oxide film 10 with a thickness of about 500 to 5000 angstroms is formed on the stopper layer 8 in accordance with the LPCVD method, as a mask to be used when trenches are formed.

Figure 4B:
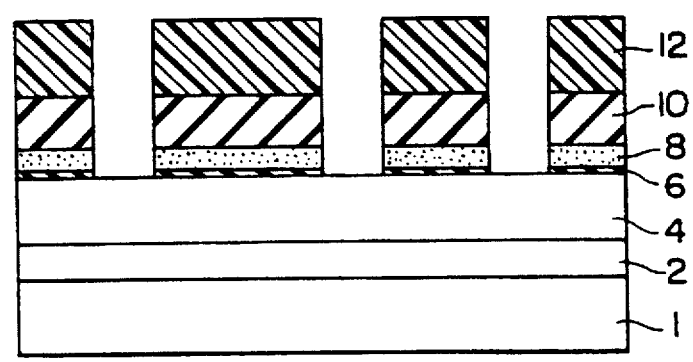

As shown in FIG. 4B, after a photoresist layer 12 has been formed, the formed photoresist 12 is patterned in accordance with photolithography to make a mask. With the photoresist layer 12 as a mask, the mask layer 10, the stopper layer 8 and the oxide film 6 are all selectively removed by anisotropic etching.

Figure 4C:
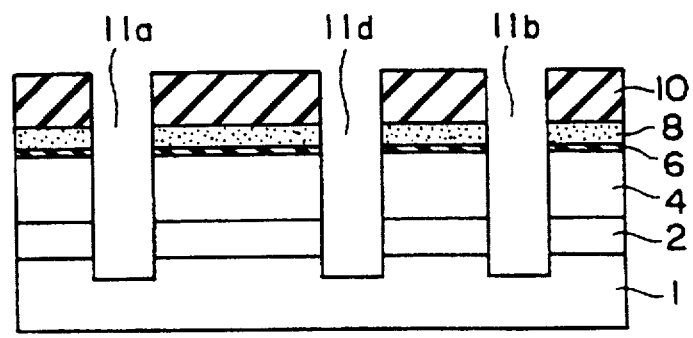

Further, as shown in FIG. 4C, after the photoresist layer 12 has been removed, trenches 11a, 11b and 11d of a depth of about 0.2 to 2 μm, for instance, are formed in the silicon substrate 1 so as to penetrate the buried collector layer 2 by anisotropic etching with the oxide film 10 as a mask.

Figure 4D:
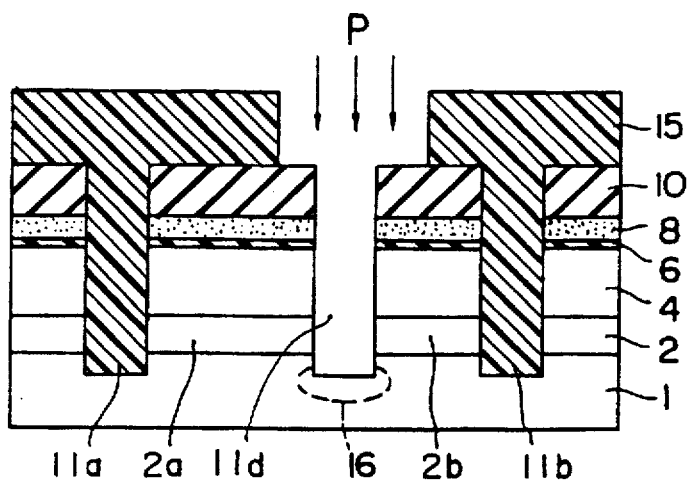

Successively, as shown in FIG. 4D, another photoresist layer 15 is formed so as to fill the trenches 11a, 11b and 11d. After that, the formed photoresist layer 15 is patterned in accordance with photolithography to expose only the trench 11d located in a transistor-forming region. Further, as shown by arrows in FIG. 4D, impurities (e.g., phosphorus) the same in conductivity (N-type) as the buried collector layer 2 are ion implanted into the bottom of the trench 11d formed in the transistor forming region, with an energy of about 50 keV and at a rate from $1 \times 10^{14}$ to $1 \times 10^{16}$ atoms/cm$^2$, to form an N-type impurity region 16, in accordance with an ion implantation technique. After that, when the substrate is heat treated between 800° to 1000° C., the two buried collector layers 2a and 2b separated in the transistor forming region can be connected to each other by the impurity region 16 now formed at the bottom of only the trench 11d (see FIG. 4E).

Figure 4E:
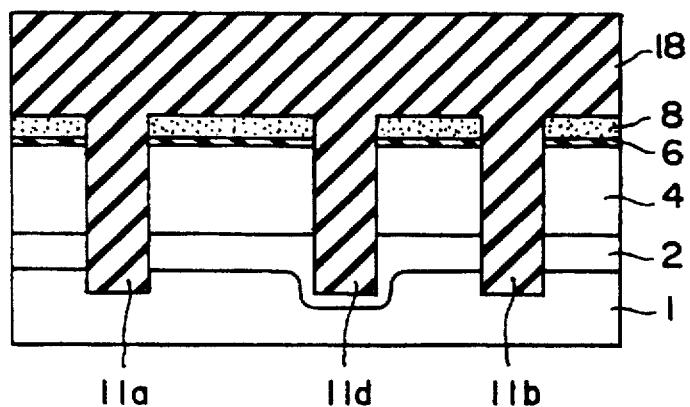

Further, as shown in FIG. 4E, after the photoresist layer 15 has been removed, an insulating material (e.g., oxide) 18 is deposited all over the surface of the trenches 11a, 11b and 11d so as to fill these trenches. Here, as the insulating material 18, an oxide containing no impurities can be used. Alternatively, BPS (Borophosphosilicate Glass) containing boron and phosphorus can be used.

Figure 4F:
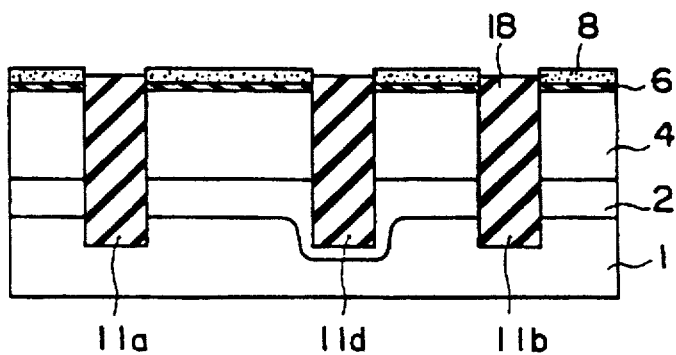

As shown in FIG. 4F, the insulating film 18 is selectively etched until the polysilicon film 8 is exposed. After that, the polysilicon layer 8 is removed, and then a bipolar transistor as shown in FIG. 3 is formed in accordance with the ordinary bipolar transistor forming process, that is, in the order of the buried collector lead electrode layer 20, the base region 22, the emitter region 24, the respective lead electrodes 26 and 30, and the aluminum electrodes 44a, 44b and 44c via the interlayer insulating film 42.

Figure 1:
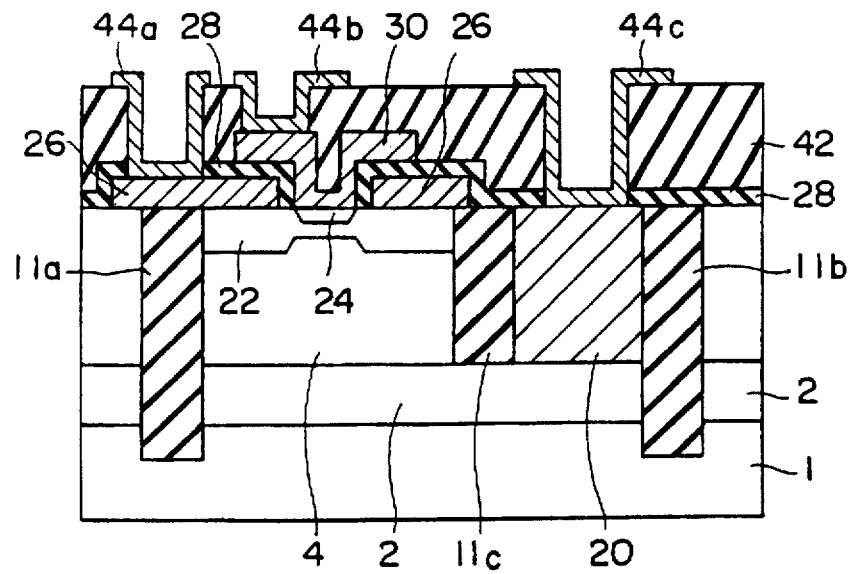
FIG. 1 is a cross-sectional view showing a first prior art semiconductor device related to the present invention.
Figure 2:
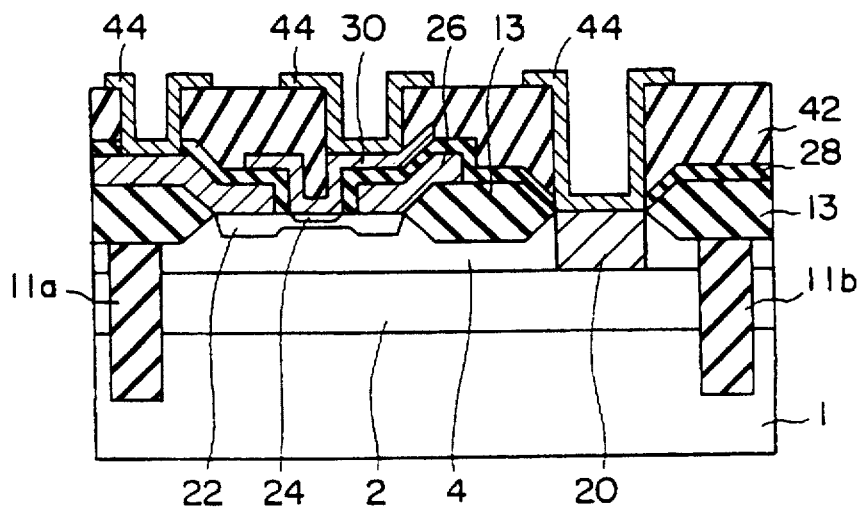
FIG. 2 is a cross-sectional view showing a second prior art semiconductor device related to the present invention.

As described above, in the first embodiment of the present invention, since impurities that are the same in conductivity as the buried collector layers 2a and 2b are ion implanted into the bottom of the element-separating trench 11d to form an impurity region 16 in order to connect the buried collector layers 2a and 2b electrically therethrough, it is possible to form the element separating trenches of the same depth. Accordingly, it is possible to reduce the number of element separation forming steps and thereby to economize the processing time, as compared with the prior art semiconductor device as explained with reference to FIGS. 1 and 2.

Further, in the above-mentioned embodiment, an NPN transistor has been explained by way of example. Without being limited thereto, however, the present invention can be, of course, applied to a PNP transistor.

Figure 5:
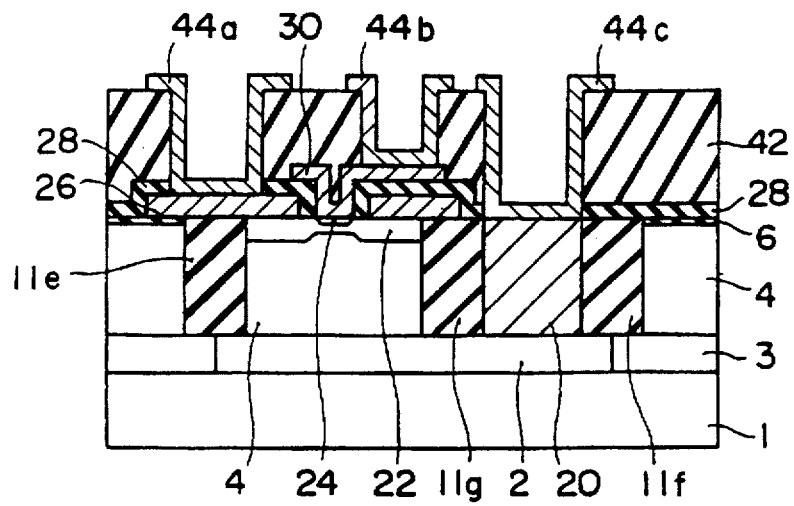
FIG. 5 is a cross-sectional view showing a second embodiment of the semiconductor device according to the present invention.

A second embodiment of the semiconductor device according to the present invention will be described hereinbelow with reference to FIG. 5. In this second embodiment, the bipolar transistor is separated by the conventional PN separation. In more detail, the buried collector layer 2 is formed under the transistor region and the conductivity of a layer adjacent to this buried collector layer 2 is opposite to that of the buried collector layer 2. Further, element separation regions 11e and 11f are formed at the boundary between the buried collector layer 2 and the adjacent layer 3. In this embodiment, the depths of these element separation regions 11e and 11f are the same as that of the element separation region 11g formed in the transistor forming region. Unlike the first embodiment, however, none of the element separation regions 11e, 11f and 11g penetrate the buried collector layer 2. The same effect as with the case of the first embodiment can be, of course, attained in this second embodiment, because the buried collector layer 2 can be separated from the adjacent layer 3.

Figure 6:
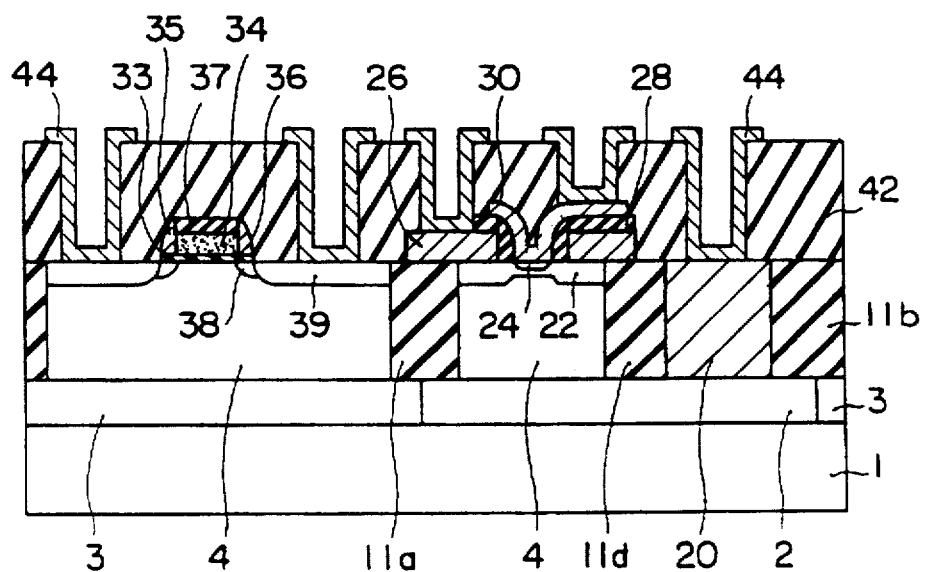
FIG. 6 is a cross-sectional view showing a third embodiment of the semiconductor device according to the present invention.

A third embodiment of the semiconductor device according to the present invention will be described hereinbelow with reference to FIG. 6. In this third embodiment, a bipolar transistor and an MOS transistor are both formed in combination on the same semiconductor substrate 1. The structure of the bipolar transistor is quite similar to that of the second embodiment shown in FIG. 5. On the other hand, the MOS transistor shown in FIG. 6 is of LDD (lightly-doped drain) structure, in which two impurity regions 38 and 39 of different concentrations are formed on the surface of the epitaxial layer 4. Further, a gate electrode composed of a polysilicon layer 34, a side wall 35 and an insulating film 37 are formed on a gate insulating film 33 formed on the epitaxial layer 4. The same effect as with the case of the second embodiment can be, of course, attained in this third embodiment.

As described above, in the semiconductor device including bipolar transistors or other transistors according to the present invention, there exists such an advantage that the element separation structure can be realized by forming a plurality of element-separating trenches of the same depth and filled with an insulating material in the epitaxial layer formed on the buried collector layer.

What is claimed is:

1. A semiconductor device comprising:

a semiconductor substrate;

a buried collector layer, having a first conductivity-type, formed on said semiconductor substrate;

an epitaxial layer formed on the buried collector layer;

a transistor region on said semiconductor substrate:

a plurality of first element-separating trenches each filled with an insulating material, wherein each of the first element-separating trenches penetrates through the epitaxial layer and the buried collector layer and penetrates into said semiconductor substrate;

at least one second element-separating trench filled with said insulating material, said at least one second element-separating trench being formed in said transistor region and having a bottom portion, said first element-separating trenches and said at least one second element-separating trench formed in said transistor region having substantially the same depth, wherein said at least one second element-separating trench formed in said transistor region penetrates through said epitaxial layer and penetrates into said buried collector layer so that the buried collector layer is separated into first and second collector layers; and an impurity region of the first conductivity-type, wherein said impurity region is formed in said semiconductor substrate and said impurity region surrounds said bottom portion of said at least one second element-separating trench formed in the transistor region, wherein said impurity region electrically connects said separated first and second collector layers.

2. The semiconductor device according to claim 1, wherein said transistor region includes a bipolar transistor having a base layer and a buried collector lead electrode layer, wherein said at least one second element-separating trench formed in said transistor region separates said base layer from said buried collector lead electrode layer.

3. The semiconductor device according to claim 1, wherein each of said first element-separating trenches and said at least one second element-separating trench formed in said transistor region have substantially the same depth in a range of from about 0.2 μm to about 2 μm.

4. A semiconductor device comprising:

a semiconductor substrate;

a buried collector layer, having a first conductivity-type, formed on said semiconductor substrate;

an epitaxial layer formed on the buried collector layer;

a transistor region on said semiconductor substrate;

a plurality of first element-separating trenches each filled with an insulating material, wherein each of the first element-separating trenches penetrates through the epitaxial layer and the buried collector layer and penetrates into said semiconductor substrate;

at least one second element-separating trench filled with said insulating material, said at least one second element-separating trench being formed in said transistor region and having a bottom portion, said first element-separating trenches and said at least one second element-separating trench formed in said transistor region having substantially the same depth, wherein said at least one second element-separating trench formed in said transistor region penetrates through said epitaxial layer and penetrates into said buried collector layer so that the buried collector layer is separated into first and second collector layers; and an impurity region of the first conductivity-type, wherein said impurity region is formed in said semiconductor substrate and said impurity region surrounds said bottom portion of only said at least one second element-separating trench formed in the transistor region, wherein said impurity region electrically connects said separated first and second collector layers.

5. The semiconductor device according to claim 4, wherein said transistor region includes a bipolar transistor having a base layer and a buried collector lead electrode layer, wherein said at least one second element-separating trench formed in said transistor region separates said base layer from said buried collector lead electrode layer.

6. The semiconductor device according to claim 4, wherein each of said first element-separating trenches and said at least one second element-separating trench formed in said transistor region have substantially the same depth in a range of from about 0.2 μm to about 2 μm.

7. A semiconductor device comprising:

a semiconductor substrate;

a buried collector layer, having a first conductivity-type, formed on said semiconductor substrate by laminating said buried collector layer over an entire upper surface of said semiconductor substrate;

an epitaxial layer formed on the buried collector layer;

a transistor region on said semiconductor substrate;

a plurality of first element-separating trenches each filled with an insulating material, wherein each of the first element-separating trenches penetrates through the epitaxial layer and the buried collector layer and penetrates into said semiconductor substrate;

at least one second element-separating trench filled with said insulating material, said at least one second element-separating trench being formed in said transistor region and having a bottom portion, said first element-separating trenches and said at least one second element-separating trench formed in said transistor region having substantially the same depth, wherein said at least one second element-separating trench formed in said transistor region penetrates through said epitaxial layer and penetrates into said buried collector layer so that the buried collector layer is separated into first and second collector layers; and an impurity region of the first conductivity-type, wherein said impurity region is formed in said semiconductor substrate and said impurity region surrounds said bottom portion of said at least one second element-separating trench formed in the transistor region, wherein said impurity region electrically connects said separated first and second collector layers.

8. The semiconductor device according to claim 7, wherein said transistor region includes a bipolar transistor having a base layer and a buried collector lead electrode layer, wherein said at least one second element-separating trench formed in said transistor region separates said base layer from said buried collector lead electrode layer.

9. The semiconductor device according to claim 7, wherein each of said first element-separating trenches and said at least one second element-separating trench formed in said transistor region have substantially the same depth in a range from about 0.2 µm. to about 2 µm.

* * * * *